United States Patent [19]
Khatri et al.

[11] Patent Number: 5,347,523
[45] Date of Patent: Sep. 13, 1994

[54] DATA PROCESSING SYSTEM HAVING SERIAL SELF ADDRESS DECODING AND METHOD OF OPERATION

[75] Inventors: Sunil P. Khatri; William C. Bruce, Jr., both of Austin; William C. Moyer, Dripping Springs, all of Tex.

[73] Assignee: Motorola, Inc., Schaumburg, Ill.

[21] Appl. No.: 174,960

[22] Filed: Dec. 27, 1993

Related U.S. Application Data

[63] Continuation of Ser. No. 844,056, Mar. 2, 1992, abandoned.

[51] Int. Cl.$^5$ .............................................. H04B 17/00
[52] U.S. Cl. ................... 371/22.3; 371/15.1; 371/22.1
[58] Field of Search ............. 371/22.3, 11.3, 15.1, 371/22.1, 25.1, 17, 20.4, 20.5, 20.6, 29.1, 22.6, 21.1, 72; 395/200; 375/25, 27, 94; 324/73 R, 158 R; 364/926.1, 927.9

[56] References Cited

U.S. PATENT DOCUMENTS

| | | | |
|---|---|---|---|
| 4,697,257 | 9/1987 | Wakai | 371/25.1 |
| 4,701,921 | 10/1987 | Powell et al. | 371/25.1 |
| 4,710,931 | 12/1987 | Bellay et al. | 371/15.1 |
| 4,710,933 | 12/1987 | Powell et al. | 371/22.3 |
| 4,728,883 | 1/1988 | Green | 371/25.1 |
| 4,780,874 | 10/1988 | Lenoski | 377/25.1 |
| 4,821,290 | 4/1989 | Hingorani et al. | 375/25 |
| 4,853,929 | 8/1989 | Azuma et al. | 371/22.3 |
| 4,855,670 | 8/1989 | Green | 371/25.1 |
| 4,862,072 | 8/1989 | Harris et al. | 371/25.1 |
| 4,947,357 | 8/1990 | Stewart et al. | 371/22.3 |
| 5,153,882 | 10/1992 | Lyon et al. | 371/22.3 |
| 5,229,999 | 7/1993 | Cushing et al. | 371/22.3 |

*Primary Examiner*—Robert W. Beausoliel, Jr.
*Assistant Examiner*—Dieu-Minh Le
*Attorney, Agent, or Firm*—Keith E. Witek

[57] ABSTRACT

A data processing system (90) having a serial scan circuit (10). The serial scan circuit (10) has an address detector (12) for detecting and decoding M serially-provided address bits. Coupled to the address detector (12) is a clock generator (14) which is used for providing at least one derived clock signal. Coupled to the address detector (12) and the clock generator (14) is a serial scan chain (16) which is used to store N serially-provided data bits. A plurality of serial scan chains (10) is connected in a parallel configuration and used to form the data processing system (90). The M address bits and the N data bits are serially provided via a single conductor (24) in a time division multiplexed operation. Integrated circuit surface area is reduced by avoiding large address and data buses, and bus routing.

22 Claims, 6 Drawing Sheets

DATA PROCESSING SYSTEM HAVING SERIAL SELF ADDRESS DECODING AND METHOD OF OPERATION

This application is a continuation of prior application Ser. No. 07/844,056, filed Mar. 02, 1992, now abandoned.

FIELD OF THE INVENTION

The present invention relates generally to data processors, and more particularly, to serial data processing.

BACKGROUND OF THE INVENTION

Serial scan chain circuits are electronic circuits that are used mostly for integrated circuit or circuit board diagnostics, troubleshooting, functionality testing, or like applications. A serial scan chain circuit accepts as an input a fixed number of serial data bits and stores this serial data into a shift register or a like alterable memory. The serial data that is stored in the serial scan chain circuit is then used internally by the integrated circuit to initiate and test certain predetermined features or functions of the integrated circuit.

One method used to implement a serial scan chain circuit is to have N serial scan chain circuit shift registers each with M bits of storage. N and M are integer values. The N serial scan chain circuit shift registers are connected in series, meaning that the first bit of shift register P (where $1<P<N+1$) is connected to the last bit M of the previous shift register, which is the $(P-1)^{th}$ shift register. The first shift register in the chain is connected to a serial data input and the $M^{th}$ bit of the $N^{th}$ shift register is connected to a serial output line. This method of serial scan chaining is not flexible. In order to write serially to one scan chain shift register, all scan chains shift registers change value due to the serially connected architecture.

In order to allow for the use of a predetermined one of a plurality of serial scan chain circuit shift registers without the serial inter-dependence described above, a parallel method may be used. The parallel method has N serial scan chain circuit shift registers, each having a separate input and output with each input connected together and each output connected together. Therefore, the serial scan chain circuit shift registers are not connected in series and operate independent from one another due to the fact that each shift register can be altered without altering another shift register. A address in parallel bit form is used to select which serial scan chain circuit shift register is enabled to accept serial data. The address requires M bits for every $2^M$ shift registers in the serial scan chain circuit. Therefore, several conductors need to be routed for the address bus in addition to serial data lines and control lines. The resulting overhead is significant.

SUMMARY OF THE INVENTION

The previously mentioned disadvantages are overcome and other advantages achieved with the present invention. The present invention comprises a data processing system having a serial scan chain circuit and a method of serially scanning data into a serial scan circuit or a data processing system. In one form, the invention is a serial scan circuit in a data processing system having a means for address detecting. The means for address detecting has a first input for serially receiving M address bits from a serial communication conductor within the data processing system wherein M is an integer. The means for address detecting has a second input for receiving a system clock signal and an output for providing an address match signal indicating detection of receipt of a predetermined binary address from the serial communication conductor. A means for clock generation has a first input coupled to the output of the means for detecting. The means for clock generation has a second input for receiving the system clock signal, and an output for selectively providing at least one control clock signal in response to both the address match signal and the system clock signal. A storage means has a first input coupled to the at least one control clock signal. The storage means has a second input coupled to the serial communication conductor for serially receiving N data bits, where N is an integer. The serial communication conductor is time division multiplexed to serially provide both the M address bits and a first set of N data bits. The storage means selectively stores the first set of N data bits in response to the at least one control clock signal. The storage means has an output for concurrently serially providing a second set of N data bits in response to the at least one control clock signal.

The present invention will be more clearly understood from the detailed description below in conjunction with the accompanying drawings.

DESCRIPTION OF THE PREFERRED EMBODIMENT

Figure 1:
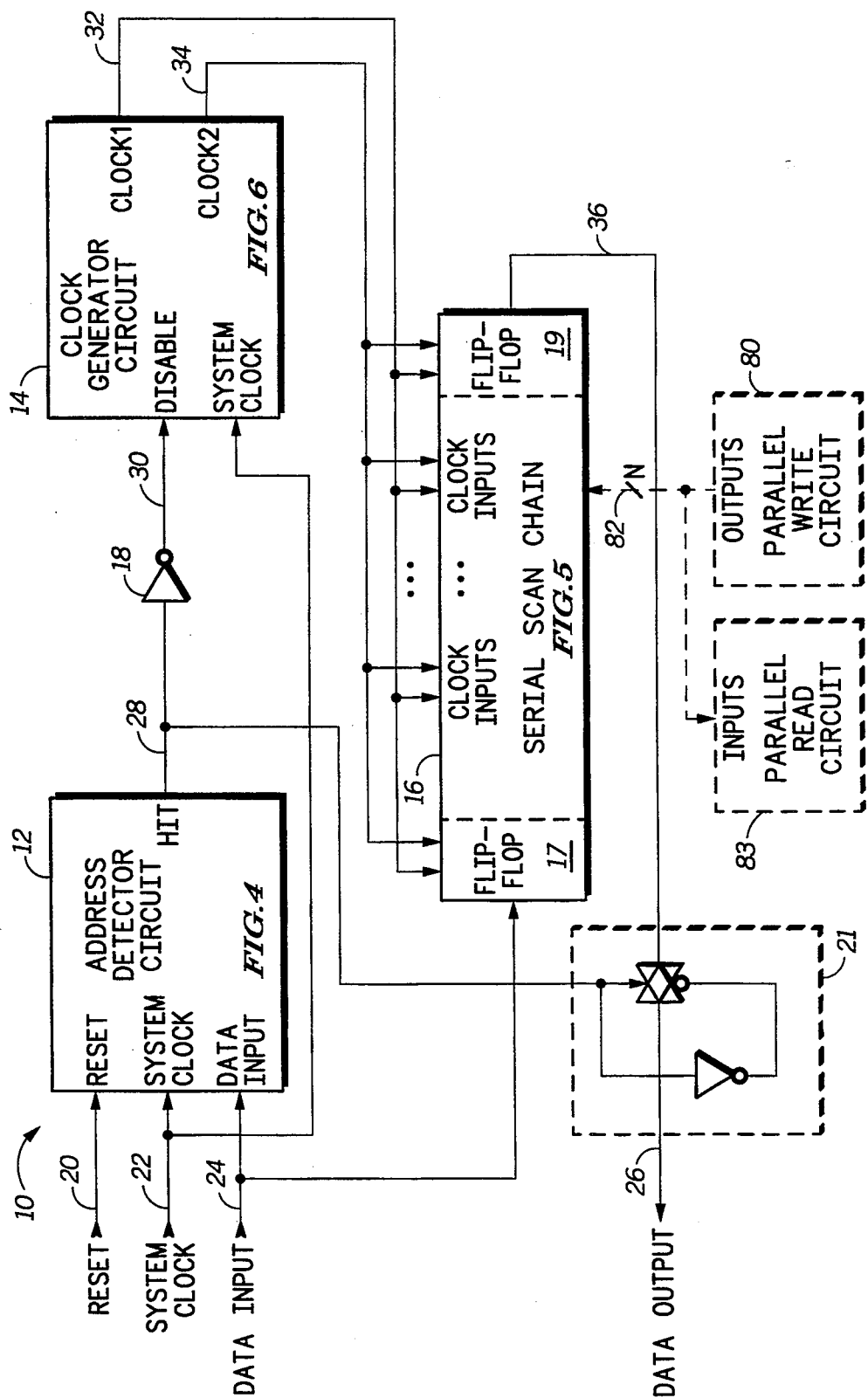
FIG. 1 illustrates, in block diagram form, a data processing system having a single serial scan chain circuit in accordance with the present invention.

Illustrated in FIG. 1 is a serial scan circuit 10 for use in a data processing system. Circuit 10 has three main functional blocks. Circuit 10 has an address decoder or an address detector circuit 12 coupled to a clock generator circuit 14. The clock generator circuit 14 is connected to a serial scan chain 16.

In FIG. 1, address detector circuit 12 has an input labeled "data input" connected to a serial communication conductor 24. Conductor 24 communicates a serial stream of binary data. M serially-provided address bits are provided to the address detector circuit 12 via the conductor 24, wherein M is an integer. The address detector circuit 12 has an input labeled "system clock" for receiving a conductor 22. Conductor 22 carries a system clock signal that is used to trigger, alter, or control various components in the circuit 10. The clock signal is preferably a 50% duty cycle square wave with a predetermined constant frequency in the range of 0KHz (direct current) to 100MHz. It should be noted that higher frequencies are possible for the clock signal but are not typical. Address detector circuit 12 has an input labeled "reset" which receives a conductor 20. The "reset" input functions as a reset signal for the circuit 10 and resets the address detector circuit 12. Resetting the address detector circuit 12 may also reset the clock generator circuit 14 and/or the serial scan chain 16 although a complete reset operation in this manner is not always required.

The address detector circuit 12 has an output labeled "hit" which provides an address match signal to a conductor 28. The output "hit" provides a logic low state, which is usually a signal that is substantially close to zero volts, to the conductor 28 when the circuit 10 has not been selected. Once the address detector circuit 12 has determined that the circuit 10 has been selected via receipt of an M-bit predetermined binary address, the output "hit" will provide a logic one state.

In FIG. 1, the clock generator circuit 14 has an input labeled "disable" for receiving a conductor 30. Conductor 30 couples a control signal to the clock generator circuit 14 which functions as an enable/disable signal. When the control signal is a logic high signal the clock generator circuit 14 is disabled. When the control signal is a logic low signal the clock generator circuit 14 is enabled to generate two clock signals.

In one form, an inverter 18 provides the address match signal via the conductor 30 to the disable input. The inverter 18 has an input connected to the output of the address detector circuit 12. The inverter 18 is used to invert the address match signal provided by the address detector circuit 12. It should be apparent that inverter 18 can be removed, thereby connecting conductor 30 directly to conductor 28. This direct connection will result in the input "disable" becoming an input "enable" that is equivalent to the address match signal.

Clock generator circuit 14 has an input "system clock" connected to the conductor 22. Therefore, the same clock signal that is supplied to the address detector circuit 12 is supplied to the clock generator circuit 14. The clock generator circuit 14 generates at least one derived output control clock. In FIG. 1, two non-overlapping control clock signals are provided via the outputs "clock 1" and "clock 2". The serial scan chain 16, in a preferred form, requires that the at least one derived clock be two non-overlapping clock signals. Non-overlapping clock signals are two clocks signals A and B wherein signals A and B are 180° out of phase from each other and both signals A and B are never at a logic high state simultaneously. It should be noted that the serial scan chain 16 may be modified to require only one clock or more than two clocks. The outputs "clock 1" and "clock 2" respectively provide the two non-overlapping clock signals to output conductors 32 and 34.

Serial scan chain 16 has an input connected to the serial communication conductor 24. This input provides a first set of N serially-provided data bits to the serial scan chain 16, where N is an integer. It should be emphasized that the N serially-provided data bits and the M serially-provided address bits are time division multiplexed and provided via the same conductor 24. The serial scan chain 16 has an input for receiving the at least one derived clock. In the illustrated form, two inputs respectively labeled "clock 1" and "clock 2" are used to respectively receive the two non-overlapping clock signals from conductors 32 and 34. An output of serial scan chain 16 allows for the concurrent output of an output serial stream of data via conductor 36. The output serial stream of data is a second set of N data bits. In general, serially transmitted bits are referred to as being a "stream" of data. In a preferred form, serial scan chain 16 uses a serial shift register to store serial data. This serial shift register approach is illustrated by a serial connection of flip-flops in serial scan chain 16. Two of the flip-flops, a first flip-flop and a last flip-flop in the serial scan chain 16, are respectively labeled as flip-flops 17 and 19.

The conductor 36 is connected to an enable circuit 21. In most cases, the enable circuit 21 is a tri-state buffer (three-state buffer) or a multiplexer. In FIG. 1 a tri-state buffer is illustrated as the enable circuit 21. The enable circuit 21 provides a selected output signal via a conductor 26 in response to the address match signal provided by conductor 28. If circuit 10 has not been addressed or selected, which is determined by address detector circuit 12, conductor 26 is "floating" or electrically isolated from the conductor 36 and therefore provides no output signal. This method of "floating" or providing signals is commonly used for interfacing a plurality of signals to a single bus or conductor.

FIG. 1 further illustrates a parallel writing circuit 80 that is connected to the serial scan chain 16. The parallel writing circuit 80 has at least one and up to N parallel outputs that can write, in parallel, binary data bits or any form of binary information to the serial scan chain 16 via conductors 82. This parallel writing method is useful in many cases where a microprocessor, which contains a plurality of circuits 10, must feedback information to an external test unit (not illustrated). The microprocessor may send information to the external test unit (not illustrated) by writing the information into the serial scan chain 16. Subsequently, the external test unit (not illustrated) will scan the information out of the serial scan chain 16 via conductors 36 and 26. It is important to note that the parallel writing circuit 80 is optional and is not required in order for circuit 10 to function. A parallel read circuit 83 may be also connected to the serial scan chain 16 to allow parallel reading of a binary value stored in the serial scan chain 16.

Figure 2:
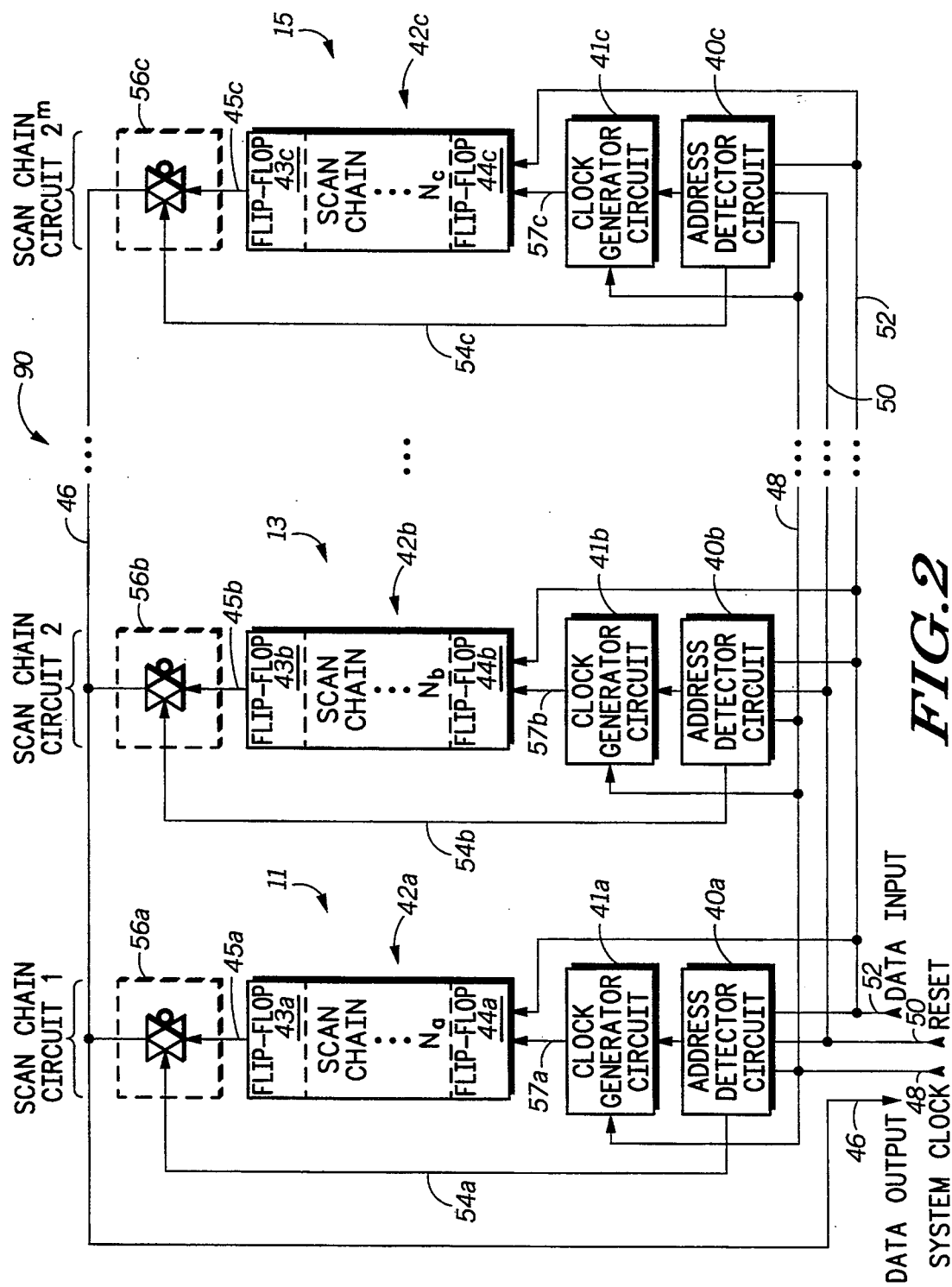
FIG. 2 illustrates, in block diagram form, another data processing system having a plurality of serial scan chain circuits.

In FIG. 2, a plurality of serial scan circuits each in accordance with FIG. 1 is used to form a serial scan chain system or data processing system 90. If M bits are used to address the circuit 10, then any integer number of scan chain circuits 10 ranging from one to $2^M$ can be addressed in system 90. FIG. 2 specifically illustrates three serial scan chain circuits 11, 13, and 15 out of a maximum total of $2^M$ possible serial scan chain circuits. Therefore, the system 90 will on some occasions make reference to only three serial scan chain circuits 11, 13, and 15, although many more scan chain circuits may be used. A serial communication conductor 52 provides a serial stream of binary data analogous to the serial stream of binary data provided by the conductor 24 of FIG. 1. A conductor 50 communicates a reset signal analogous to the reset signal communicated by the conductor 20 of FIG. 1. A conductor 48 communicates a system clock signal analogous to the clock signal communicated by the conductor 22 of FIG. 1. Conductor 46 communicates a selected output signal analogous to the selected output signal communicated by the conductor 26 of FIG. 1.

Each of the serial scan circuits 11, 13, and 15 respectively has an address detector circuit 40a, 40b, and 40c analogous to FIG. 1. Each of the serial scan circuits 11, 13, and 15 respectively has a clock generator circuit 41a, 41b, and 41c analogous to that of FIG. 1. Each of the serial scan circuits 11, 13, and 15 respectively has a serial scan chain 42a, 42b, and 42c. In each of the serial scan circuits 11, 13, and 15 there are respectively a predetermined number Na, Nb, and Nc of serially connected flip-flops to form a serial shift register or like storage device. The flip-flops and their serial connection are illustrated via first flip-flops 44a, 44b and 44c and last $N^{th}$ flip-flops 43a, 43b, and 43c. Each of the serial scan chains 42a, 42b, and 42c is preferably an N-bit serial shift register wherein Na, Nb, and Nc may vary respectively between the scan chain circuits 11, 13, and 15. The outputs of the serial scan chain circuits 11, 13, and 15 are labeled as conductors 45a, 45b, and 45c and are each analogous to conductor 26 of FIG. 1.

Each of the serial scan circuits 11, 13, and 15 respectively has a selection circuit or enable circuit 56a, 56b, and 56c. Each of the enable circuits 56a, 56b, and 56c is either a tri-state buffer as illustrated, a tri-state inverter, or a multiplexer. The serial scan chains 42a, 42b, and 42c respectively receive the conductors 48 and 52 and at least one clock signal represented by conductor 57a, 57b, and 57c. A "disable" signal (not labeled but illustrated) is connected from the address detector circuits 40a, 40b, and 40c respectively to the clock generator circuits 41a, 41b, and 41c. Each of the address detector circuits 40a, 40b, and 40c respectively has an output conductor 54a, 54b, and 54c for respectively controlling the enable circuits 56a, 56b, and 56c.

Each of the enable circuits 56a, 56b, and 56c has an output that connect to conductor 46. Therefore, conductor 46 forms a single conductor time multiplexed bus for the output of all of the serial scan chain circuits 11, 13, and 15. The conductors 52, 50, 48, and 46 are all connected to each of the serial scan chain circuits 11, 13, and 15 the same as illustrated in FIG. 1 and discussed in reference to FIG. 1. It should be noted that the M serially-provided address bits and the N serially-provided data bits are provided serially and time multiplexed via the same conductor 52 to each of the serial scan chain circuits 11, 13, and 15.

Due to the fact that the serial scan chains are independently addressed, each of the serial scan chain circuits 11, 13, and 15 can have a value of N, which represents a data length in bits, that is different. For example, serial scan chain circuit 11 may have an N value of eleven. Therefore, the serial scan chain requires a unique M-bit address for proper selection and eleven data bits once it is selected. In the same system 90, serial scan chain circuit 13 may have an N value of sixty-four. Therefore, the serial scan chain requires a unique M bit address for proper selection and sixty-four data bits once it is selected. In a same manner, serial scan chain circuit 15 can have an N value of 36 and so on.

Figure 3:
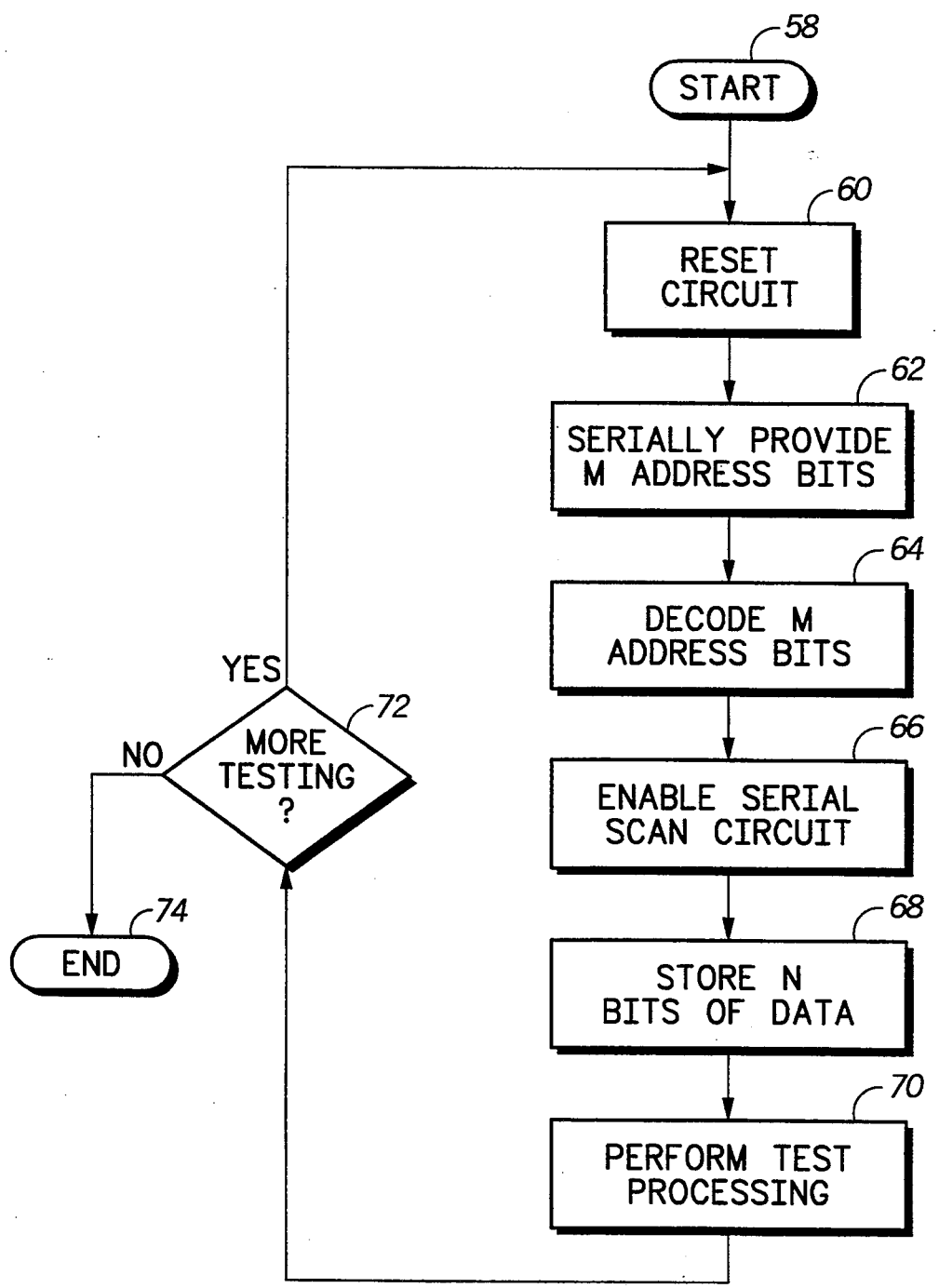
FIG. 3 illustrates in a flowchart a method for serially scanning data into the system of either FIG. 1 or FIG. 2 in accordance with the present invention.

In FIG. 3, a flowchart illustrates a method that is used for implementing a serial scan procedure for the system 90. In a step 58, an external test unit is initialized with test vectors, also known as test data. Each of the test vectors is a binary value that has a first M-bit address portion and a second N-bit data portion. The N-bit data portion may, as indicated previously, vary for each unique address. All of the test vectors are to be serially transferred to the system 90 via the conductor 52.

The system 90 is reset via a power up, an interrupt or exception, or the initiation of a new test vector transfer in a step 60. The initiation of a new test vector transfer is the most common cause for reset. A reset is performed in the system 90 by toggling the conductor 50 from a logic low state to a logic high state and back to a logic low state. As long as conductor 50 carries a logic low signal, the system 90 will not experience a reset. A reset informs the system 90 address detector circuits 40a, 40b, and 40c that a new test vector containing M address bits and an address-dependent N data bits is being provided serially via conductor 52.

After reset, the test vector is sent serially via conductor 52. The M address bits are sent serially first. In a step 62, the M address bits are stored in each of the address detector circuits 40a, 40b and 40c. Each of the address detector circuits 40a, 40b, and 40c use address detector logic and an M-bit serial shift register to store the M address bits. Once M address bits have been stored in all of the address detector circuits of system 90, each of the address detector circuits 40a, 40b, and 40c stop storing binary bits from the conductor 52.

Once the M address bits have been stored simultaneously in each address detector circuit during step 62, a step 64 is performed. In step 64, the address bits are decoded by each of address detector circuits 40a, 40b, and 40c of system 90 to determine which of the up to $2^M$ possible serial scan chain circuits in system 90 are selected. In most cases, the decoding requires a NAND or NOR of several signals, but may involve other complex decoding schemes such as a table look-up approach or use of virtual addresses. Usually, only one serial scan chain circuit of system 90 is selected, but any number of scan chains can be selected by assigning an identical address to a plurality of serial scan chain circuits.

In a step 66, the address decoding is complete and one or more of serial scan circuits 11, 13 through 15 are selected. Assume, for ease of explanation, that serial scan circuit 13 is selected. Selection occurs in serial scan circuit 13 via the conductor 28 of FIG. 1, which couples the address detector circuit 40b to the clock generator circuit 41b in FIG. 2. Conductor 28 provides a logic high state as the address match signal. The address match signal then starts the clock generator circuit 41b of serial scan circuit 13. The clock generator circuit 41b of serial scan circuit 13 provides the serial scan chain 42b of serial scan circuit 13 with the two non-overlapping clock signals required for storing data. In addition, enable circuit 56b, which is the selection circuit for serial scan circuit 13, is enabled in order to drive the output conductor 46.

In a step 68, N data bits are serially stored within the serial scan chain 42b of the selected serial scan circuit 13. Once N data bits are received by the serial scan chain 42b and stored, the clock generator circuit 41b of serial scan circuit 13 is disabled and the N data bits remain stored. Serial scan chain circuit 13 is disabled via a reset of system 90 or by stopping the at least one control clock signal. As the N data bits are shifted into serial scan chain circuit 13, N old data bits are shifted out of the serial scan circuit 13 and provided serially on conductor 46. In one form, the N old data bits are transmitted to a test unit (not illustrated) either in series or parallel.

In a step 70, the N data bits that were stored in system 90 are used for test purposes or for like hardware or software requirements. Data is written into the serial scan chains for serial communication via the output conductor 46 on a next serial scan circuit 13 test vector load procedure. In a step 72, if more test vectors or testing is needed via the system 90, steps 60 through 70 are repeated until no more testing is required. If no further test vectors are available or no more testing is needed, the method of FIG. 3 ends via a step 74.

Figure 4:
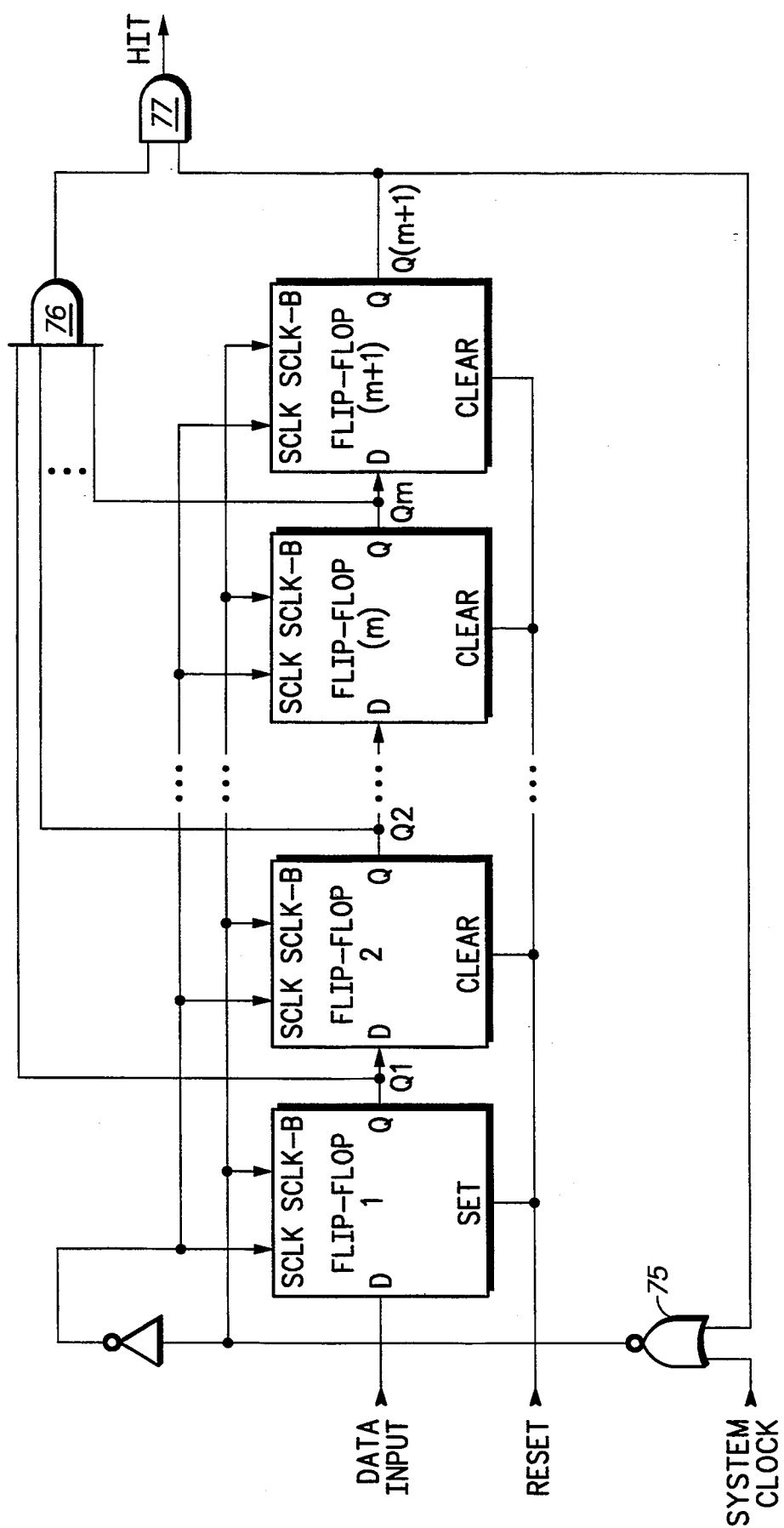
FIG. 4 illustrates, in block diagram form, an address detector circuit of FIG. 1.

FIG. 4 illustrates in more detail the address detector circuit 12 of FIG. 1. In a preferred form, a serial connection of (M+1) flip-flops is used. Initially all of the flip-flops are reset. The leftmost flip-flop is reset by setting the flip-flop to a logic high state. All other flip-flops are reset by clearing the flip-flops to a logic low state. The M serially-provided address bits are shifted from left to right through all of the (M+1) flip-flops until the logic high state initially placed into the leftmost flip-flop reaches the last flip-flop (M+1) in the chain. When the leftmost flip-flop logic high bit is shifted to the last flip-flop (M+1), all of the M address bits have been received in flip-flops 1 through M. A NOR gate 75 is used to shut off the clocks to all of the (M+1) of flip-flops and hold the M address bits in place. A first AND gate 76 checks all the M serially-provided address bits to determine if an enabling address was sent. If an enabling address was sent, the output of a second AND is a logic high state "hit" signal and signifies that a selection has been determined. If the output "hit" of the second AND gate 77 remains low no address selection is determined.

It should be apparent that inverters may be placed in the electrical paths marked $Q_1$ through $Q_M$ before AND gate 76. In addition, most flip-flops are capable of providing an inverted output signal of $Q_1$ through $Q_M$. Either inverters or the inverted output signal of $Q_1$ through $Q_M$ may be used for address decoding. Inverters or inverted flip-flop outputs, when connected to AND gate 76, allow $2^M$ addresses to be used for the serial scan circuits.

Figure 5:
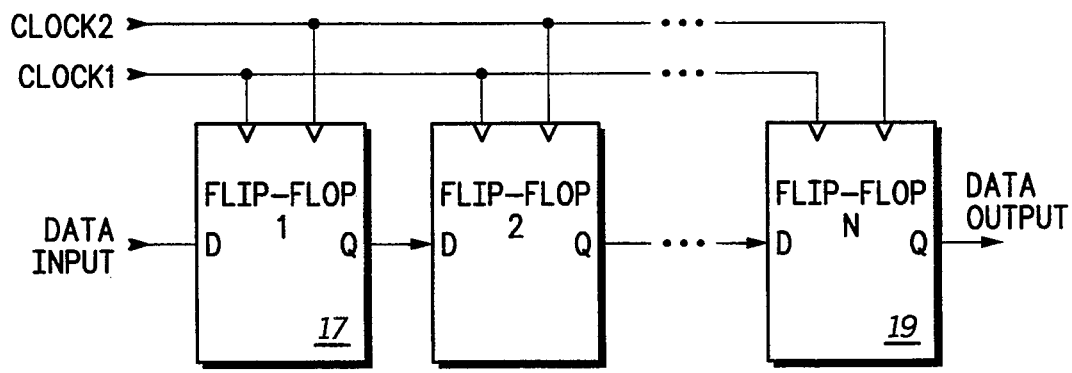
FIG. 5 illustrates, in block diagram form, a serial scan chain of FIG. 1.

In FIG. 5, the serial scan chain 16 of FIG. 1 is illustrated in more detail. Flip-flops 17 and 19 are identified to better correlate FIG. 1 to FIG. 5. The serial scan chain 16 is a serial shift register that uses two non-overlapping clocks to store and propagate data in a master-slave fashion. A serial data input and a serial data output are illustrated.

Figure 6:
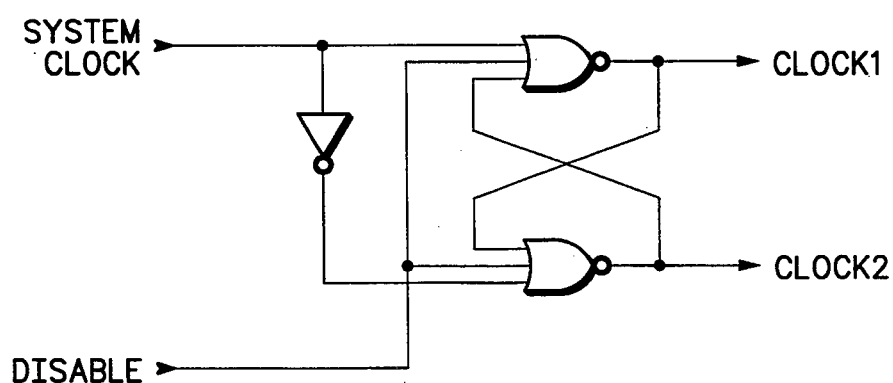
FIG. 6 illustrates, in logic diagram form, a clock generator circuit illustrated in FIG. 1.

In FIG. 6, the clock generator circuit 14 of FIG. 1 is illustrated in further detail. Two non-overlapping clocks, labeled "clock 1" and "clock 2" are provided by the circuit of FIG. 6. The disable signal functions as an enable/disable input. If the disable signal is in a logic high state then the circuit of FIG. 6 will produce no clocks. When the input signal disable is in a logic low state, then the non-overlapping clocks are generated via system clock oscillation.

Figure 7:
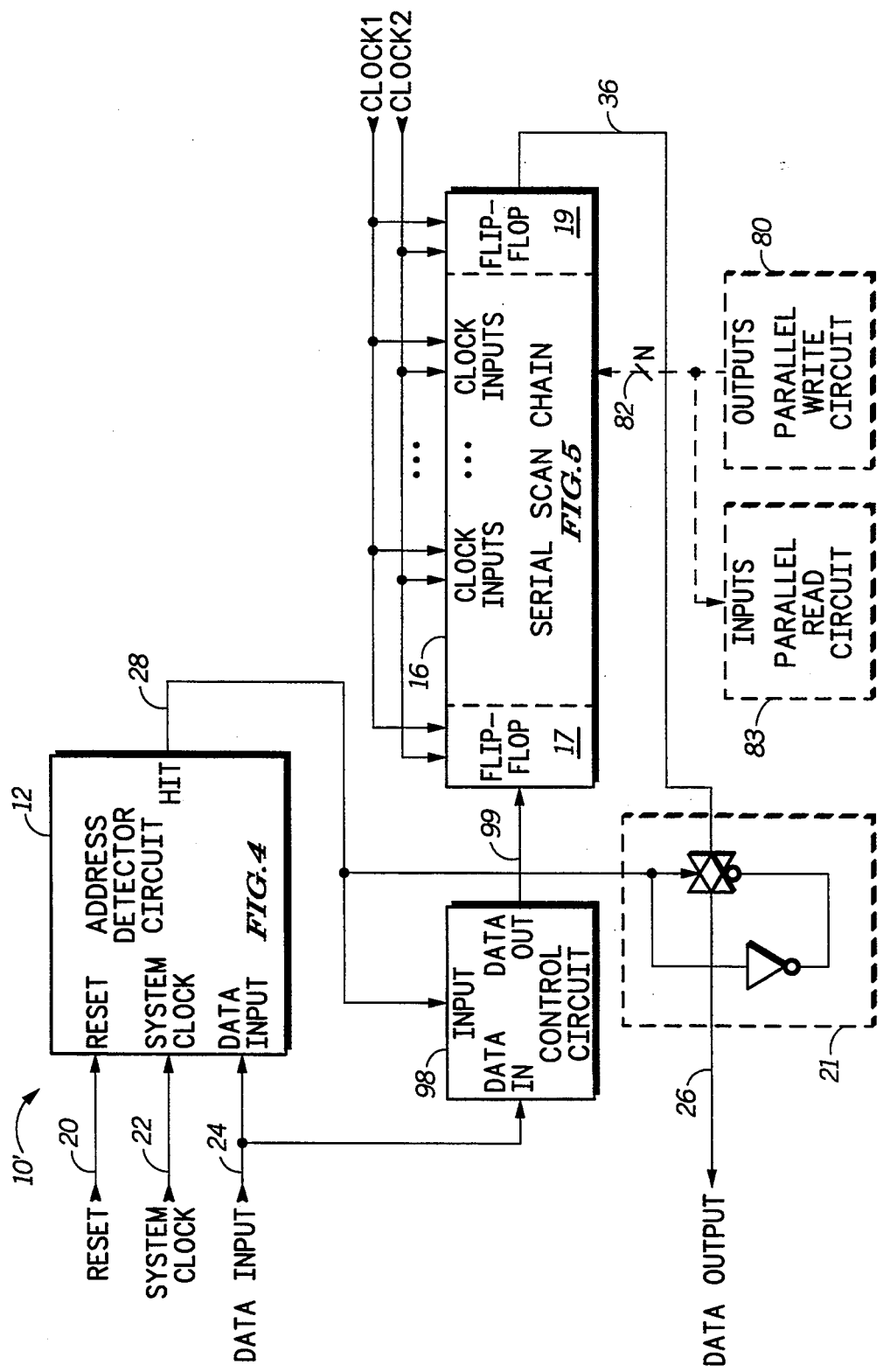
FIG. 7 illustrates, in block diagram form, another data processing system having serial address decoding in accordance with the present invention.

In FIG. 7, an alternative embodiment serial scan chain circuit 10' is illustrated. FIG. 7 is similar to FIG. 1 with a only few exceptions. Due to the fact that FIG. 1 and FIG. 7 are similar, common elements are identically labeled. The clock generator circuit 14 has been removed in FIG. 7. The inputs "clock 1" and "clock 2" are now free-running clocks and require no enable/disable function. A control circuit 98 is illustrated in FIG. 7 as having an input for receiving the "hit" signal from address detector 28 via conductor 28. The control circuit 98 has an output that is connected to the input of the serial scan chain 16 via a conductor 98 and has an input for receiving serial input data via conductor 24.

In FIG. 7, the control circuit 98 is used to control data which is input to the serial scan chain 16. If the data input is in an idle state, in an address transmission state or in a disabled state, the "hit" signal informs the control circuit 98 to shift default idle data into the serial scan chain 16. Idle data can either be logic zeros or logic ones or a combination of both. Once circuit 10' of FIG. 7 is addressed and enabled by the "hit" signal on conductor 28, conductor 99 is coupled by control circuit 98 to the data input signal provided via conductor 24. Serial data which is input into the serial scan chain 16 proceeds as in FIG. 1. The enable circuit 21 is used to output serial data as described herein.

Clock 1 and clock 2 are free-running clocks which ensure that the serial scan circuit 16 will always be shifting in data or default values from the control circuit 98. This default data shifting may not be desirable if the data in the serial scan chain 16 is needed for output via conductor 26. Therefore, incorrect data must be periodically replaced by correct data using the parallel write circuit 80 if data in the serial scan chain 16 is to be preserved.

There has been presented herein a serial scan circuit and a serial scan system formed by a plurality of serial scan circuits. Due to the fact that each of the serial scan circuits of the serial scan system needs only one conductor to provide both the M serially-provided address bits and N serially-provided data bits, integrated circuit area for the serial scan system is reduced. This reduction in surface area is more pronounced if the serial scan circuits are separated by a large distance within an integrated circuit. Each serial scan circuit can be accessed independently of each other and each may be of varying bit lengths or bit size. The feature of having various bit lengths for each serial scan chain is advantageous because integrated circuits may have varying bus sizes or circuits and/or peripherals that vary in the number of input bits which are required. Therefore, individual scan chains may be dedicated to certain test functions or certain portions of circuitry, or may be as general as necessary. In addition, several serial scan chains in the system can be selected at once if the several serial scan chains have the same address. Therefore, portions of an integrated circuit can be tested concurrently with equivalent or different test vectors, and testing can be better coordinated.

While the present invention has been illustrated and described with reference to specific embodiments, further modifications and improvements will occur to those skilled in the art. For example, there are several methods and circuits that may be used to store a serial stream of data. Many addressing or address decoding schemes are available. Other clock signal configurations besides a two clock non-overlapping configuration can be used for the serial scan chain circuits described herein. Several serial scan chain circuits can be interconnected in many ways to form a serial scan chain system. The inputs and outputs to functional blocks illustrated herein may be changed to modify serial scan circuit functionality for specific requirements. Known structured designed techniques, such as level sensitive scan design (LSSD) and scan-path designs, can be implemented using the inventive device. The scan chain circuits disclosed herein can be made of serial shift registers or like storage devices. Control signals can be altered in polarity and logic gate interconnects may vary. It is to be understood, therefore, that this invention is not limited to the particular forms illustrated and that it is intended in the appended claims to cover all modifications that do not depart from the spirit and scope of this invention.

We claim:

1. In a data processing system, a serial self-address decoding circuit used for serially receiving address and data, comprising:

means for address detecting, said means having a first input for serially receiving M address bits from a serial communication conductor within the data processing system, where M is an integer, a second input for receiving a system clock signal, and an output for providing an address match signal indicating detection of receipt of a predetermined binary address from the serial communication conductor;

a means for clock generation having a first input coupled to the output of the means for address detecting, a second input for receiving the system clock signal, and an output for selectively providing at least one control clock signal in response to both the address match signal and the system clock signal, the means for clock generation being enabled when the address match signal is asserted and being disabled when the address match signal is deasserted; and a storage means having at least one clock input coupled to the at least one control clock signal, a second input coupled to the same serial communication conductor which is used to receive the M address bits, the serial communication conductor being used to serially transmit a first set of N data bits separate from the M address bits, where N is an integer, the serial communication conductor being time division multiplexed to serially provide both the M address bits to the means for address detecting, in a first time interval, and the first set of N data bits to the storage means, in a second time interval, wherein the first and second time intervals do not overlap, said storage means selectively storing the first set of N data bits in response to a predetermined M address bits being received by the means for address decoding and in response to the at least one control clock signal, and having an output for concurrently serially providing a second set of N data bits in response to the at least one control clock signal.

2. The serial scan circuit of claim 1 further comprising:

means for writing coupled to the storage means, the means for writing having N parallel outputs coupled to a third input of the storage means, said means for writing selectively altering the first set of N data bits stored in the storage means.

3. The serial scan circuit of claim 1 wherein the means for clock generation generates first and second non-overlapping control clock signals as the at least one control clock signal to control the storage of the first set of N data bits by the storage means, the first and second clock non-overlapping signals being respectively coupled to a first clock input and a second clock input of the storage means wherein the first and second clock inputs form the at least one clock input, the first and second non-overlapping control clock signals controlling the serial clocking of the first set of N data bits into the storage means and controlling the storage means to serially provide the second set of N data bits at the output of the storage means.

4. The serial scan circuit of claim 1 further comprising:

an enable circuit coupled to the storage means, the enable circuit coupling the second set of N data bits from the output of the storage means to an output terminal in response to the address match signal.

5. The serial scan circuit of claim 4 wherein the data processing system further comprises a plurality of serial scan circuits, each according to the serial scan circuit of claim 4, an output terminal of each serial scan circuit being electrically connected together, each serial scan circuit being connected to the serial communication conductor for receiving the M address bits and subsequently selectively storing the first set of N data bits.

6. The serial scan circuit of claim 4 wherein the data processing system further comprises a plurality of serial scan circuits, each according to the serial scan circuit of claim 4, an output terminal of each serial scan circuit being electrically connected together, each serial scan circuit being connected to the serial communication conductor for receiving a first predetermined number of M address bits and subsequently selectively receiving N data bits, wherein the numerical value of N may vary between each of the serial scan circuits in the plurality of serial scan circuits.

7. The serial scan circuit of claim 6 wherein the data processing system comprises a plurality of serial scan circuits, each of the serial scan circuits formed in accordance with claim 6, wherein the plurality of serial scan circuits contains from two to $2^M$ serial scan circuits connected in parallel.

8. The serial scan circuit of claim 1 wherein the storage means further comprises an N-bit serial shift register circuit.

9. The serial scan circuit of claim 1 wherein the means for address detecting is an M-bit serial shift register circuit.

10. In a data processing system, a method of self-address decoding within a serial scan circuit in a serial manner, the method comprising the steps of:

providing data on a serial communication conductor wherein the serial communication conductor provides both M address bits and N data bits, where M and N are integers, the M address bits being provided in a different time interval than the N data bits;

serially receiving the M address bits from the serial communication conductor;

detecting whether the M address bits match a predetermined address value;

providing an address match signal indicating detection of receipt of the predetermined address value from the serial communication conductor;

receiving a system clock signal of the data processing system;

enabling a clock generator in response to the address match signal to provide at least one control clock signal in response to both the address match signal and the system clock signal; and serially receiving and selectively storing N data bits in a storage means of the serial scan circuit in response to the at least one control clock signal, and concurrently serially providing at an output of the serial scan circuit the N data bits in response to the at least one control clock signal, the N data bits being provided by the serial communication conductor in a time period after the receipt of the M address bits.

11. The method of claim 10 further comprising the step of:

selectively altering the N data bits in the storage means to a predetermined binary value.

12. The method of claim 10 further comprising the step of:
   resetting the data processing system to initialize the data processing system prior to the step of receiving the M address bits.

13. The method of claim 10 further comprising the steps of:
   providing a plurality of serial scan circuits, each serial scan circuit being coupled in parallel and having an address detector for receiving the M address bits from the serial communication conductor;
   serially scanning N data bits from thru only a predetermined one of the serial scan circuits in response to the M address bits.

14. A serial scan circuit using M serially-provided address bits to permit storage of N serially-provided data bits wherein the M serially-provided address bits are self-decoded and M and N are integers, the serial scan circuit comprising:
   an address detector circuit having a first input connected to a serial communication conductor for receiving the serially provided M address bits, a second input for receiving a system clock signal, and an output for providing an address match signal indicating detection of receipt of a predetermined binary address from the serial communication conductor;
   a clock generator circuit having a first input coupled to the output of the address detector circuit for receiving the address match signal, a second input for receiving the system clock signal, and an output for providing a control clock signal in response to both the address match signal and the system clock signal; and
   a serial scan chain of flip-flop circuits having a first input coupled to the control clock signal, a second input coupled to the serial communication conductor for serially receiving N data bits only if the predetermined binary address is received by the address detector circuit, the serial communication conductor being configured to serially provide both the M address bits and the N data bits, said serial scan chain of flip-flop circuits selectively storing the N data bits in response to the control clock signal, and having an output for concurrently serially providing the N data bits in response to the control clock signal.

15. The serial scan circuit of claim 14 further comprising:
   a parallel writing circuit coupled to the serial scan chain of flip-flops, the parallel writing circuit having a predetermined number within a range of one to N of parallel outputs for altering at least a portion of the N serially-provided data bits stored in the serial scan chain of flip-flops.

16. The serial scan circuit of claim 14 further comprising:
   an enable circuit having an input coupled to the output of the serial scan chain of flip-flops coupling the N data bits to an output terminal thereof in response to the address match signal.

17. The serial scan circuit of claim 16 further comprising:
   a plurality of serial scan circuits, each according to the serial scan circuit of claim 16, the output terminal of each serial scan circuit being electrically connected together, each serial scan circuit being connected to the serial communication conductor for receiving the M address bits and subsequently selectively storing the N data bits.

18. The serial scan circuit of claim 16 further comprising:
   a plurality of serial scan circuits, each according to the serial scan circuit of claim 16, the output terminal of each serial scan circuit being electrically connected together, each serial scan circuit being connected to the serial communication conductor for receiving a first predetermined number of address bits and subsequently selectively receiving a second predetermined number of N data bits, the second predetermined number of N data bits varying in value between each of the serial scan circuits.

19. The serial scan circuit of claim 18 wherein the plurality of serial scan circuits comprises $2^M$ or less serial scan circuits.

20. In a data processing system, a plurality of serially coupled storage devices forming a serial scan circuit, the serial scan circuit having serial address decoding wherein a serially provided bit stream of M address bits addresses the serial scan circuit, the serial scan circuit comprising:
   a means for address detecting having a first input for serially receiving the M address bits from a single serial communication conductor within the data processing system, where M is an integer, a second input for receiving a system clock signal, and an output for providing an address match signal indicating detection of receipt of a predetermined binary address from the serial communication conductor;
   a means for input control coupled to the means for address detecting and having a first input coupled to the single serial communication conductor, a second input for receiving the address match signal, and an output for selectively providing a first set of N serial data bits received via the single serial communication conductor, where N is an integer;
   a storage means having a first input coupled to at least two control clock signals, a second input coupled to the output of the means for input control for serially receiving the first set of N data bits, the serial communication conductor being time division multiplexed to serially provide both the M address bits and the first set of N data bits, said storage means selectively storing the first set of N data bits in response to the at least two control clock signals, and having an output for concurrently serially providing a second set of N data bits in response to the at least one control clock signal; and
   means for output control coupled to the storage means for serially receiving the second set of N data bits and transmitting the N data bits via an output conductor in response to the address match signal.

21. A data processing system for serially receiving and processing I serial bits of data, the data processing system comprising:
   a single serial communication conductor used for providing I serial bits of data to the data processing system, wherein the I serial bits of data include M serially provided address bits and N serially provided data bits, where I, M, and N are positive integers and I is equal to (N plus M);
   a system clock conductor for providing a system clock signal;

an address detector having a first input coupled to the system clock conductor, a second input coupled to the single serial communication conductor, and an output for providing a control signal, the address detector decoding the M serially provided address bits and selectively asserting the control signal in response to receiving M serially provided address bits which indicate a predetermined binary address value; and a plurality of storage devices having a first input coupled to the single serial communication conductor, a second input for receiving a serial scan clock wherein the serial scan clock is enabled only if the predetermined binary address is received by the address detector, and an output for providing serial output data, one of the plurality of storage devices storing the N bits of serially provided data in response to the assertion of the control signal.

22. A data processing system having a plurality of self-address decoding serial scan circuits comprising:

a first self-address decoding serial scan circuit comprising:

a first address detection circuit having a first input coupled to a system clock conductor, a second input coupled to a single serial communication conductor, and an output for providing a control signal, the first address detector circuit decoding M serially provided address bits which are provided by the single serial communication conductor and selectively asserting the control signal in response to receiving M serially provided address bits which indicate a predetermined binary address value;

a first clock generation circuit having an input for receiving the control signal from the first address detection circuit and an output for providing a first selective clock signal, the first selective clock signal functioning only if the control signal is asserted; and a first serial data storage device having an input for receiving the first selective clock signal and an input coupled to the single serial communication conductor for receiving N serially provided data bits after the M serially provided address bits are received, the N serially provided data bits being stored by the first serial data storage device only if the first selective clock signal is functioning in response to the control signal of the first address detection circuit;

a second self-address decoding serial scan circuit coupled in parallel to the first self-address decoding serial scan circuit, the second self-address decoding serial scan circuit comprising:

a second address detection circuit having a first input coupled to a system clock conductor, a second input coupled to a single serial communication conductor, and an output for providing a second control signal, the second address detector circuit decoding M serially provided address bits which are provided by the single serial communication conductor and selectively asserting the second control signal in response to receiving M serially provided address bits which indicate a predetermined binary address value;

a second clock generation circuit having an input for receiving the second control signal from the second address detection circuit and an output for providing a second selective clock signal, the second selective clock signal functioning only if the second control signal is asserted; and a second serial data storage device having an input for receiving the second selective clock signal and an input coupled to the single serial communication conductor for receiving N serially provided data bits after the M serially provided address bits are received, the N serially provided data bits being stored by the second serial data storage device only if the second selective clock signal is functioning in response to the control signal from the second address detection circuit.

* * * * *